US008749980B2

(12) United States Patent
Won et al.

(10) Patent No.: US 8,749,980 B2
(45) Date of Patent: Jun. 10, 2014

(54) MOBILE TERMINAL

(75) Inventors: Dongsu Won, Seoul (KR); Seunghwan Jang, Seoul (KR); Yongsang Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 457 days.

(21) Appl. No.: 13/016,908

(22) Filed: Jan. 28, 2011

(65) Prior Publication Data
US 2011/0188207 A1 Aug. 4, 2011

(30) Foreign Application Priority Data

Jan. 29, 2010 (KR) .................. 10-2010-0008301
Jan. 29, 2010 (KR) .................. 10-2010-0008307

(51) Int. Cl.
*H05K 7/20* (2006.01)

(52) U.S. Cl.
USPC ...... 361/710; 361/679.54; 361/708; 361/720; 361/800; 361/831; 438/76.1; 438/487; 438/660; 174/258; 174/548

(58) Field of Classification Search
USPC .............. 361/676–678, 679.46–679.54, 361/688–690, 701–722, 760–762, 807–812, 361/831
See application file for complete search history.

(56) References Cited

U.S. PATENT DOCUMENTS

| 6,944,028 | B1 * | 9/2005 | Yu et al. | 361/737 |
|---|---|---|---|---|
| 7,035,110 | B1 * | 4/2006 | Wang et al. | 361/737 |
| 7,407,390 | B1 * | 8/2008 | Ni | 439/76.1 |
| 7,802,997 | B2 * | 9/2010 | Kuo | 439/76.1 |
| 8,215,981 | B2 * | 7/2012 | Liu et al. | 439/487 |
| 8,295,048 | B2 * | 10/2012 | Sharifipour et al. | 361/710 |
| 2003/0174467 | A1 * | 9/2003 | Lu | 361/695 |
| 2005/0085129 | A1 * | 4/2005 | Chiou et al. | 439/607 |
| 2007/0127223 | A1 | 6/2007 | Mitsuhashi | |
| 2007/0217171 | A1 | 9/2007 | Le | |
| 2008/0059680 | A1 * | 3/2008 | Hiew et al. | 710/301 |
| 2009/0052142 | A1 * | 2/2009 | Brewer et al. | 361/721 |

FOREIGN PATENT DOCUMENTS

| CN | 1627893 | 6/2005 |
|---|---|---|
| EP | 1956812 | 8/2008 |

OTHER PUBLICATIONS

The State Intellectual Property Office of the People's Republic of China Application Serial No. 201110037589.9, Office Action dated Feb. 12, 2014, 10 pages.

* cited by examiner

*Primary Examiner* — Courtney Smith
(74) *Attorney, Agent, or Firm* — Lee, Hong, Degerman, Kang & Waimey

(57) ABSTRACT

A mobile terminal is provided. The mobile terminal comprises at least one element, a connector selectively connected to another device to provide a data exchange path between the at least one element and the other device, and a thermal conduction frame having one side coming into contact with the at least one element and the other side coming into contact with the connector to transfer heat generated from the at least one element to the connector. The connector is connected to the element included in the mobile terminal and the other device through the thermal conduction frame to effectively transfer heat generated from the element to the other device through the connector.

21 Claims, 25 Drawing Sheets

MOBILE TERMINAL

CROSS-REFERENCE TO RELATED APPLICATIONS

Pursuant to 35 U.S.C. §119(a), this application claims the benefit of earlier filing date and right of priority to Korean Patent Application Nos. 10-2010-0008301, filed on Jan. 29, 2010, and 10-2010-0008307, filed on Jan. 29, 2010, the contents of which are all hereby incorporated by reference herein in their entirety.

BACKGROUND

1. Field

This document relates to a mobile terminal and, more particularly, to a mobile terminal which includes a connector connected to internal elements of the mobile terminal and another device through a thermal conduction frame to effectively transfer heat generated from the elements to the other device through the connector and does not require an additional space for mounting an identify card socket therein to thereby minimize the size of the mobile terminal.

2. Related Art

Wireless communication systems are multiple access systems capable of supporting communications with multiple users by sharing available system resources (bandwidths, transmission power, etc.).

Examples of the multiple access systems include CDMA (Code Division Multiple Access) system, FDMA (Frequency Division Multiple Access) system, TDMA (Time Division Multiple Access) system, OFDMA (Orthogonal Frequency Division Multiple Access) system, and SC-FDMA (Single Carrier Frequency Division Multiple Access) system.

The wireless communication systems require to control uplink transmission power to adjust the magnitude of a received signal at a base station to an appropriate level. The base station cannot receive a transmission signal of a terminal if the uplink transmission power is too low. On the contrary, the transmission signal of the terminals may interfere transmission signals of other terminals and increases battery power consumption of the terminal when the uplink transmission power ifs too high. By controlling the uplink transmission power to maintain the magnitude of the received signal to the appropriate level, unnecessary power consumption of the terminal is prevented and a data transmission rate can be adaptively determined to improve transmission efficiency.

Accordingly, development of technology for efficiently controlling the uplink transmission power in the wireless communication systems is needed. Furthermore, it is required to minimize the size and weight of the terminal since a user generally carries the terminal and uses in a desired place.

SUMMARY

According to the mobile terminal of this document, the connector coupled to another device is connected to the internal elements of the mobile terminal through the thermal conduction frame to effectively transfer heat generated from the elements to the other device through the connector. In addition, an additional space for mounting an identify card socket in the mobile terminal is not required, and thus the size of the mobile terminal can be minimized.

BRIEF DESCRIPTION OF THE DRAWINGS

The implementation of this document will be described in detail with reference to the following drawings in which like numerals refer to like elements.

DETAILED DESCRIPTION

Implementations described below can be applied to various wireless access systems such as CDMA (Code Division Multiple Access), FDMA (Frequency Division Multiple Access), TDMA (Time Division Multiple Access), OFDMA (Orthogonal Division Multiple Access), SC-FDMA (Single Carrier Frequency Division Multiple Access) systems, etc.

CDMA can be implemented by radio technology such as UTRA (Universal Terrestrial Radio Access) and CDMA 2000. TDMA can be implemented by radio technology such as GSM (Global System for Mobile communication)/GPRS (General Packet Radio Service)/EDGE (Enhanced Data Rates for GSM Evolution). OFDMA can be implemented by radio technology such as IEEE 802.11 (Wi-Fi), IEEE806.11

(WiMAX), IEEE 802.20, and E-UTRA (Evolved UTRA). UTRA is part of UMTS (Universal Mobile Telecommunications System). 3GPP (3$^{rd}$ Generation Partnership Project), LTE (Long Term Evolution) is part of E-UMTS (Evolved UMTS) using E-UTRA and employs OFDM for downlink and use SC-FDMA for uplink. LTE-A (Advanced) is evolution of 3GPP LTE.

Hereinafter, explanation of this document is made based on 3GPP LTE/LTE-A. However, the technical spirit of this document is not limited thereto.

Figure 1:
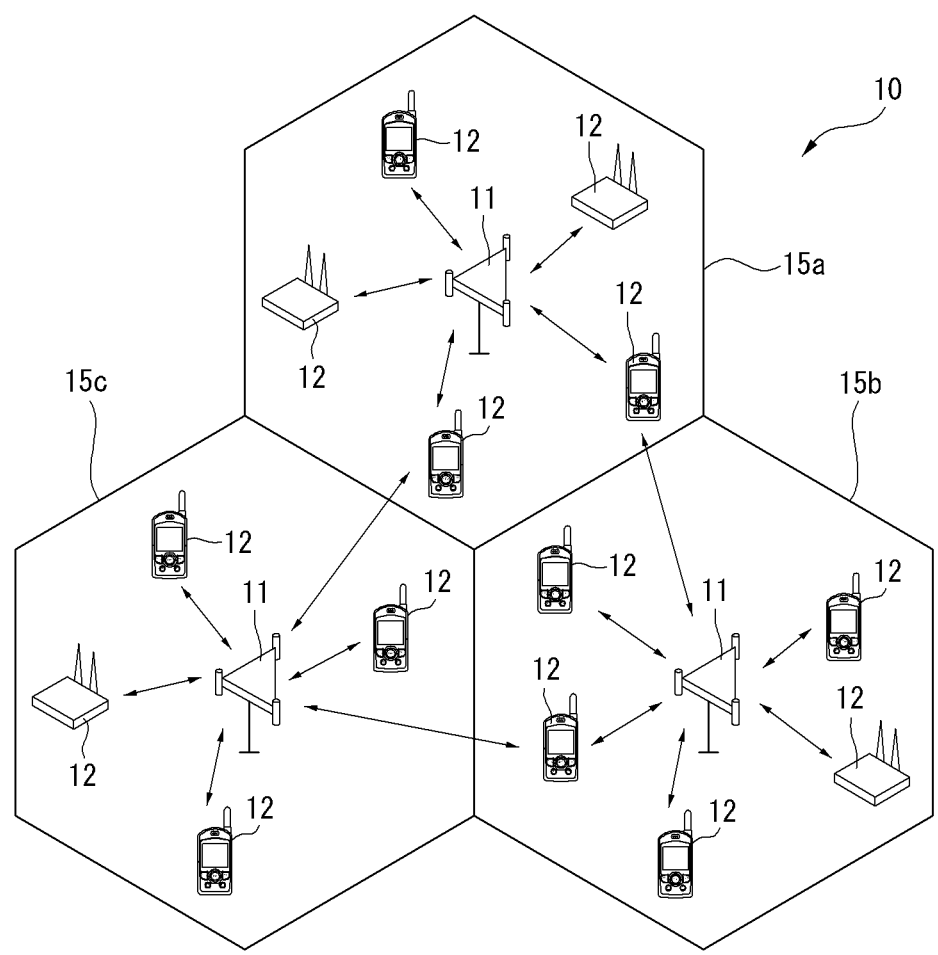
FIG. 1 illustrates a wireless communication system.

FIG. 1 illustrates a wireless communication system 10.

Referring to FIG. 1, the wireless communication system 10 includes at least one base station 11. Each base station 11 provides a communication service to specific geographical areas (generally referred to as cells) 15a, 15b and 15c. Each cell may be divided into multiple regions (referred to as sectors). A single base station may include at least one cell.

A mobile terminal 100 may be fixed or movable and referred to as mobile terminal, user equipment, user terminal, subscriber station, wireless device, personal digital assistant, wireless modem, handheld device, access terminal or the like.

The base station 11 means a fixed station communicating with the mobile terminal 100 and may be referred to as evolved-NodeB, base transceiver system, access point, access network or the like.

Hereinafter, downlink is a communication link from the base station 11 to the mobile terminal 100 and uplink is a communication link from the mobile terminal 100 to the base station 11.

A transmitter may correspond to part of the base station 11 and a receiver may correspond to part of the mobile terminal 100 in the downlink whereas a transmitter may correspond to part of the mobile terminal 100 and a receiver may correspond to part of the base station 11 in the uplink.

Figure 2:
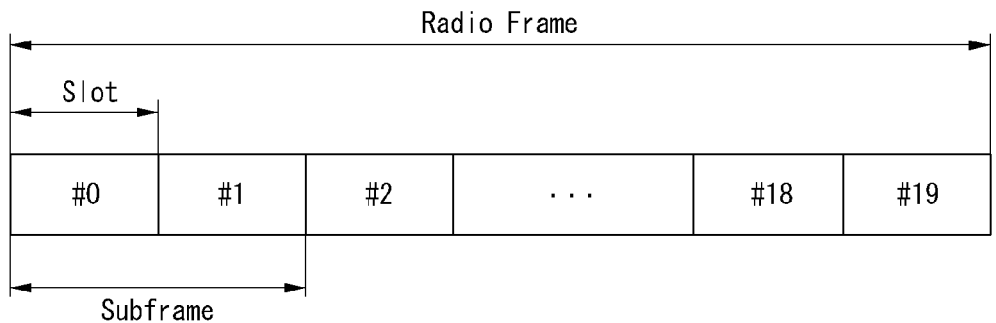
FIG. 2 illustrates a structure of a radio frame in 3GPP LTE.

FIG. 2 illustrates a structure of a radio frame in the 3GPP LTE.

Referring to FIG. 2, the radio frame includes ten subframes and a single subframe consists of two slots. A time required for a single subframe to be transmitted is referred to as transmission time interval (TTI). For example, the length of a single subframe is 1 ms and the length of a single slot is 0.5 ms.

A single slot includes multiple OFEM symbols in the time domain and includes multiple resource blocks in the frequency domain. An OFDM symbol represents a symbol period since the 3GPP LTE uses OFDM in the downlink and may be referred to as SC-FDMA symbol or symbol period according to multiple access method. A resource block is the unit of resource allocation and includes continuous subcarriers in a single slot.

The radio frame shown in FIG. 2 is exemplary and the number of subframes included in the radio frame, the number of slots includes in each subframe or the number of OFDM symbols included in each slot may be varied.

Figure 3:
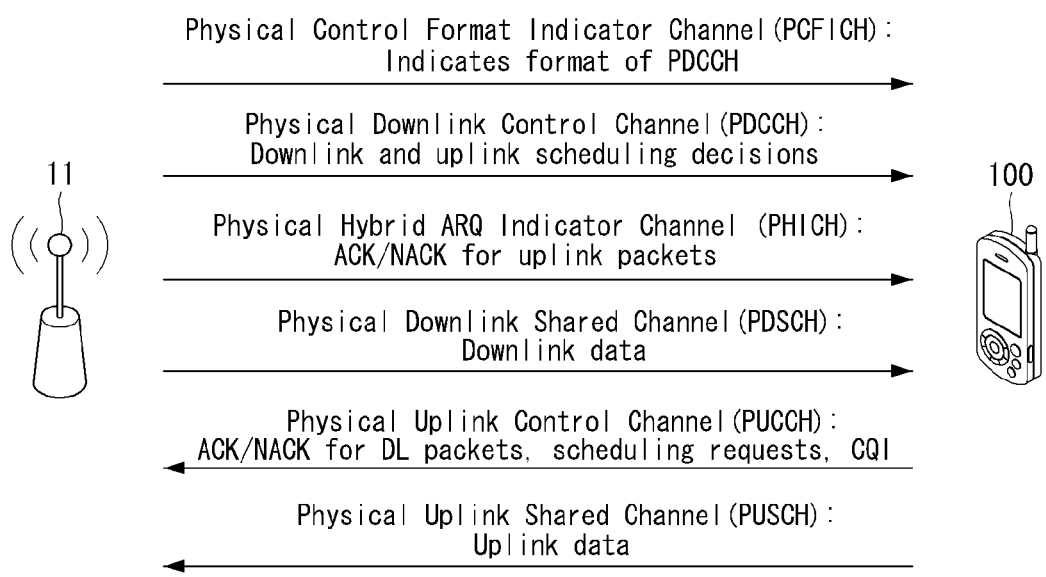
FIG. 3 illustrates exemplary communication channels corresponding to a physical layer of 3GPP LTE.

FIG. 3 illustrates exemplary communication channels corresponding to a physical layer of the 3GPP LTE. Uplink channels used in the 3GPP LTE may include a physical random access channel (PRACH) for random access, a physical uplink control channel (PUCCH) for transmitting control information, and a physical uplink shared channel (PUSCH) for transmitting data.

The PUSCH can transmit not only data but also control information, information including multiplexed data or information composed of only control information according to PUSCH transmitting and forming methods defined by LTE standards.

Random access information is used for random access between the base station 11 and the mobile terminal 100 and has significance.

The control information has significance for coverage balance of the uplink and downlink and feedback to the downlink.

The uplink channels are known so that detailed explanations thereof are omitted.

The mobile terminal 100 relating to this document will now be explained in detail with reference to the attached drawings. In the following description, suffixes "module" and "unit" are given to components of the mobile terminal in consideration of only facilitation of description and do not have meanings or functions discriminated from each other.

Figure 4:
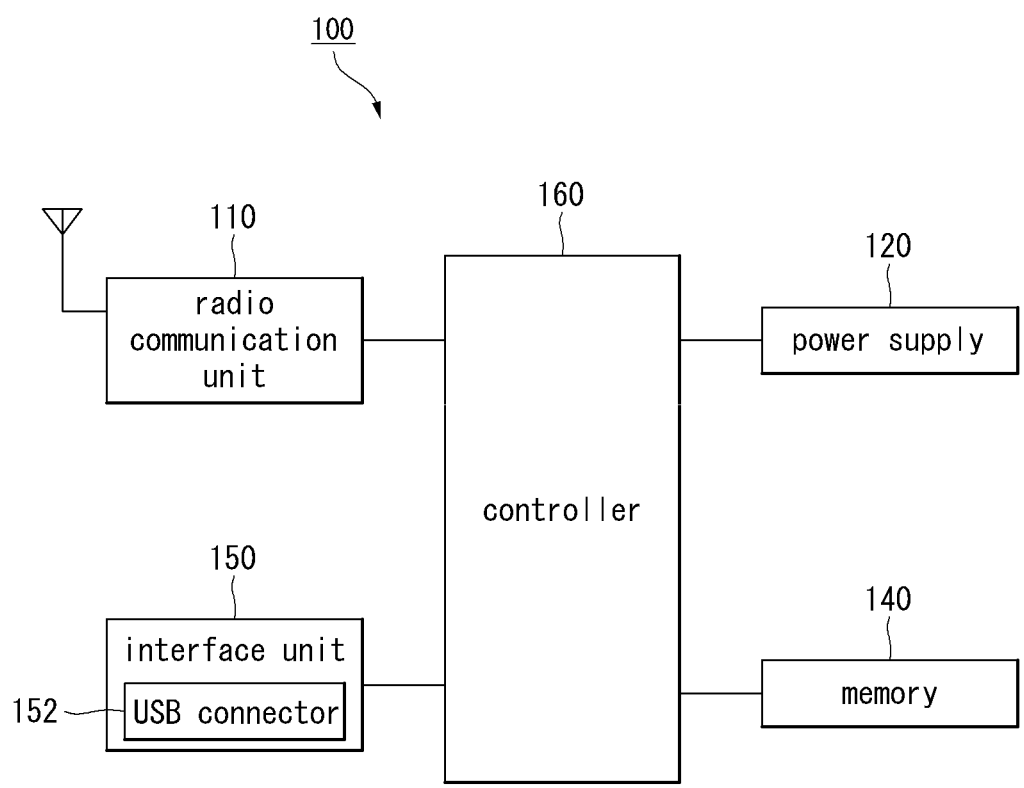
FIG. 4 is a block diagram of an implementation of a mobile terminal according to this document.

FIG. 4 is a block diagram of an implementation of the mobile terminal 100 of this document.

Referring to FIG. 4, the mobile terminal 100 includes a radio communication unit 110, a memory 140, a controller 160, a power supply 120, and an interface 150.

The radio communication unit 110 may include at least one module that enables radio communications between the mobile terminal 100 and a radio communication system or between the mobile terminal 100 and a network in which the mobile terminal 100 is located. The radio communication unit 110 may support radio communications according to at least one radio communication protocol. For example, the radio communication unit 110 can provide radio communications according to at least one of CDMA, WCDMA and LTE communication methods.

If the radio communication unit 110 provides radio communications according to different radio communication protocols, radio communication functions according to the different radio communication protocols may be implemented as a single chip or respectively implemented as separate chips.

The memory 140 may include at least one of a flash memory, a hard disk type memory, a multimedia card micro type memory, a card type memory (for example, SD or XD memory), a random access memory (RAM), a static RAM (SRAM), a read-only memory (ROM), an electrically erasable programmable ROM (EEPROM), a programmable ROM (PROM) magnetic memory, a magnetic disk, and an optical disk. In addition, the memory 140 may store programs for operating the controller 160 and temporarily store input/output data (for example, phone book, messages, still images, video, etc.).

The controller 160 controls the overall operation of the mobile terminal 100. For example, the controller 160 performs related control and processing for data communication through the radio communication unit 110 and transmission power control of uplink channels.

The power supply 120 may receive external power under the control of the controller 160 and provide power required for the components of the mobile terminal 100 to operate. An apparatus that supplies power to the power supply 120 may be another device (200 shown in FIG. 10) such as notebook computer, desktop computer, and mobile terminal. The power supply 120 may be provided with the power through a universal serial bus (USB), DC-JACK, etc.

The interface 150 functions as a channel between the mobile terminal 100 and all of external devices connected to the mobile terminal 100. The interface 150 receives data or power from an external device and transmits the data or power to corresponding components included in the mobile terminal 100 or transmits data of the mobile terminal 100 to the external device. For example, the interface 150 can include a wired/wireless headset port, an external charger port, a wired/ wireless data port, a memory card port, a port for connecting a device including an identify module to the mobile terminal 100, an audio input/output I/O) port, a video I/O port, an earphone port, etc. In the current implementation of this document, the interface 150 can be integrated with the power supply 120. That is, the power supply 120 not only supplies power but also serves as the interface 150. Furthermore, heat generated in the mobile terminal 100 may be transmitted to the other device (200 shown in FIG. 10) through the interface 150.

Figure 5:
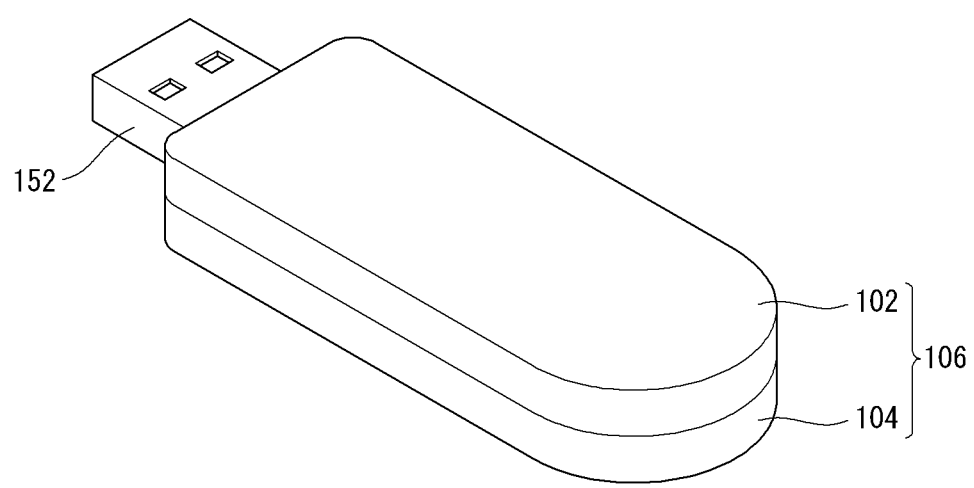
FIG. 5 is a perspective view of the mobile terminal shown in FIG. 4.

FIG. 5 is a perspective view of the mobile terminal 100 shown in FIG. 4.

Referring to FIG. 5, the mobile terminal 100 may include a case 106 and a USB connector 152 projected from the front end of the case 106. The case 106 forms the external appearance of the mobile terminal 100. The case 106 may protect the internal components of the mobile terminal 100 from external impact, temperature variation and humidity variation. To achieve this, the case 106 may be made of a synthetic resin such as engineering plastic. The case 106 may include an upper case 102 and a lower case 104 which are assembled.

Figure 10:
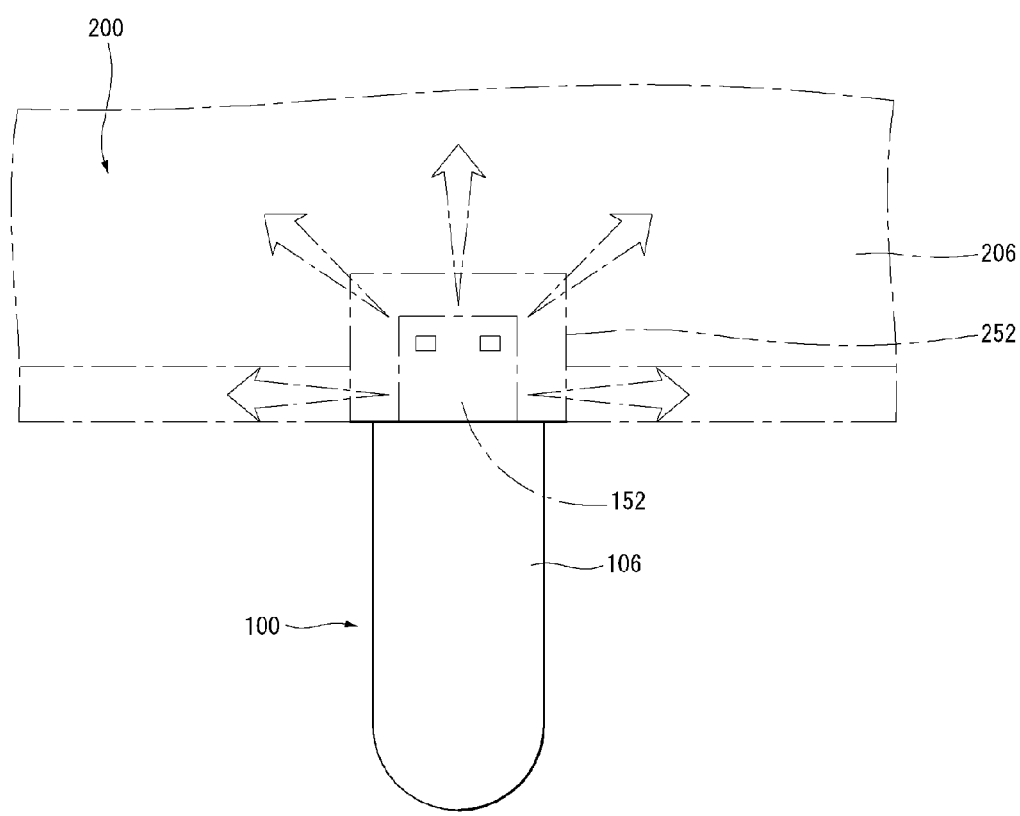
FIG. 10 is a plan view illustrating the mobile terminal shown in FIG. 4 when the mobile terminal is combined with another device.

The USB connector 152 is a path that connects the internal circuit of the mobile terminal 100 and the other device (200 shown in FIG. 10). That is, the USB connector 152 can electrically connect an element (E shown in FIG. 6) included in the mobile terminal 100 to an element included in the other device (100 shown in FIG. 10). The USB connector 152 includes contacts and is enveloped in a metal case according to standards such that the USB connector 152 can secure specific stiffness when connected to the other device (200 shown in FIG. 10). In addition, the USB connector 152 may function as a channel that transfers heat generated in the mobile terminal 100 to the other device (200 shown in FIG. 10). Elements (E shown in FIG. 6) included in the mobile terminal 100 may generate heat when the mobile terminal 100 operates due to an element that obstructs the flow of electrons. The generated heat increases the internal temperature of the mobile terminal 100 and may obstruct the normal operation of the mobile terminal 100 if the heat exceeds a predetermined degree. Furthermore, user's requirements toward the mobile terminal 100 may not be satisfied due to the heat. Accordingly, it is important to effectively manage the heat generated during the operation of the mobile terminal 100. The mobile terminal 100 can effectively emit the heat through the USB connector 152 to optimize the operation environment, which will be described in detail.

Figure 6:
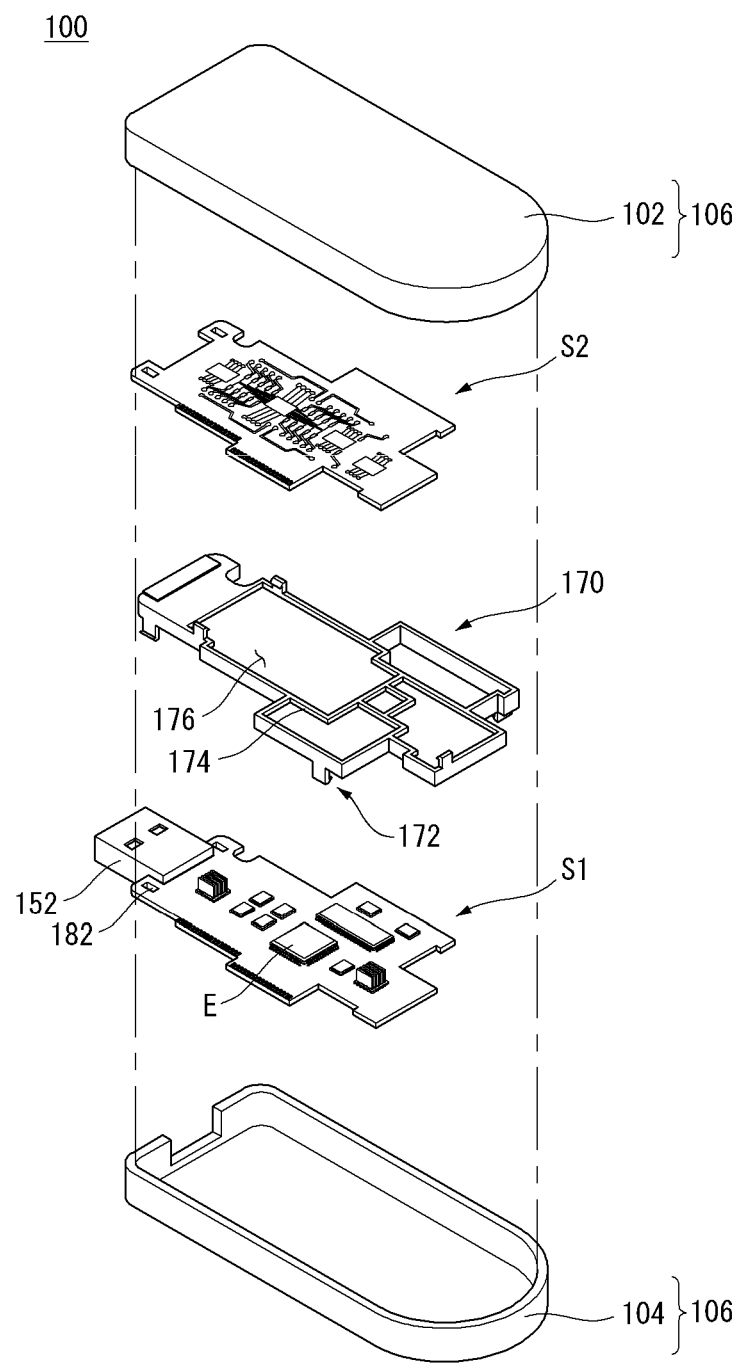
FIG. 6 is an exploded perspective view of the mobile terminal shown in FIG. 5.

FIG. 6 is an exploded perspective view of the mobile terminal 100 shown in FIG. 5.

Referring to FIG. 6, the mobile terminal 100 may include first and second printed circuit boards (PCBs) S1 and S2 provided in the case 106 and a thermal conduction frame 170 interposed between the first and second PCBs S1 and S2.

The first and second PCBs S1 and S2 may include one or more element E. PCBs can be manufactured in such a manner that signals for exchanging signals are printed on a board through etching and elements are mounted thereon. The PCBs are widely used in a variety of electronic devices since they can construct a desired circuit in a narrow space and reduce manufacturing costs. The first and second PCBs S1 and S2 include various elements E and allow the mobile terminal 100 to perform desired operations. Although the mobile terminal 100 includes the two PCBs S1 and S2 vertically arranged therein in this document, the number and position of the PCBs are not limited thereto. That is, the mobile terminal 100 can include a single PCB or three or more PCBs. In addition, PCBs included in the mobile terminal 100 can be horizontally arranged. The elements E may be mounted on the top face of the first PCB S1 and on the bottom face of the second PCB S2 such that the thermal conduction frame 170 interposed between the first and second PCBs S1 and S2 can effectively conduct the heat generated from the elements E. However, the mounting location of the elements E can be changed in a design process. The USB connector 152 may be attached to the first PCB S1.

The elements E may be various chips. Particularly, the elements E may include a communication chip including a modem chip, an RF transmitter chip and an RF receiver chip and/or a power chip including a power amplifier (PA) chip and a power management IC (PMIC) chip. The communication chip and/or the power chip may generate heat when operated. As the performance of the mobile terminal 100 is improved, the absolute quantity of power consumed by the radio communication unit in the overall power used by the mobile terminal 100 increases, and thus the quantity of heat generated from the radio communication unit also increases. Accordingly, the temperature of the mobile terminal 100 can be controlled within a stabilized range by effectively emitting the heat generated from the radio communication unit. Furthermore, the power chip that supplies power to the radio communication unit, transforms, rectifies and charges the power may generate heat due to the internal resistance thereof. The mobile terminal 100 can effectively emit the heat generated from the elements E such that the temperature of the mobile terminal 100 can be controlled to a level within a stabilized range.

The thermal conduction frame 170 may be located between the first and second PCBs S1 and S2. The thermal conduction frame 170 transfers the heat generated from the first and second PCBs S1 and S2 to the USB connector 152. That is, if heat is generated from the elements E mounted on the first and second PCBs S1 and S2, the heat can be transferred to the thermal conduction frame 170, and then transmitted to the USB connector 152. The heat transferred to the USB connector 152 may be transmitted to the other device (200 shown in FIG. 10) connected to the mobile terminal 100. Since the heat generated from the elements E is transferred to the other device (200 shown in FIG. 10) through the thermal conduction frame 170, the heat may not be kept in the mobile terminal 100. Accordingly, the internal temperature of the mobile terminal 100 can be maintained as an appropriate level. Furthermore, part of the heat generated from the elements E may be transferred to the first and second PCBs S1 and S2 and then to the thermal conduction frame 170.

The thermal conduction frame 170 may be made of a material with high thermal conductivity. For example, the thermal conduction frame 170 can be made of magnesium, magnesium alloy, aluminum, aluminum alloy, copper, or copper alloy. The thermal conduction frame 170 may generate thermal gradient between the elements E and the USB connector 152. The thermal gradient may mean that the elements E have the highest temperature, the USB connector 152 has the lowest temperature and the thermal conduction frame 170 has a temperature between the highest and lowest temperatures. Since the elements E have the highest temperature, the heat can effectively conduct from the elements E to the USB connector 152. The thermal conduction frame 170 may include a shielding rib 174 and a combining hook 172.

The thermal conduction frame 170 may be bonded to the elements E using thermal grease as a bonding material. That is, the thermal grease is coated on the elements E and the thermal conduction frame 170 is attached thereto. The thermal grease is a kind of oil and may attach the thermal conduction frame 170 to the elements E such that the heat generated from the elements E can be effectively transferred to the thermal conduction frame 170.

The thermal conduction frame 170 and the elements E may not directly come into contact with each other. That is, the thermal conduction frame 170 may be located in proximity to the elements E. In this case, the thermal conduction frame 170 may be combined with the first and second PCBs S1 and S2 through the combining hook 172 which will be explained below. Even if the thermal conduction frame 170 and the elements E are located in proximity to each other, the heat generated from the elements E can be transferred to the thermal conduction frame 170 through convection or radiation.

The shielding rib 174 may be a rib projected from the thermal conduction frame 170. That is, the shielding rib 174 may be integrated with the thermal conduction frame 170. The thermal conduction frame 170 can be formed of a metal through casting or press work. The shielding rib 174 may be formed during the thermal conduction frame manufacturing process. By forming the shielding rib 174 protruded from the thermal conduction frame 170 and dividing the thermal conduction frame 170 into multiple sections, it is possible to prevent electromagnetic waves generated from an element mounted on the first or second PCB 51 or S2, which corresponds to one of the sections, from affecting other elements. The shape and location of the shielding rib 174 may be varied according to the arrangement of the elements E mounted on the first and second PCBs S1 and S2.

The combining hook 172 is extended from the thermal conduction frame 170 and combined with the first and second PCBs S1 and S2. One side of the thermal conduction frame 170 may come into contact with the elements E and the other side thereof may come into contact with the USB connector 152. The combining hook 172 may be combined with the first and second PCBs S1 and S2 to maintain the contact of the thermal conduction frame 170 of the elements E and the USB connector 152. That is, the combining hook 172 can be combined with the first and second PCBs S1 to allow the thermal conduction frame 170 to come into contact with the elements E and the USB connector 152. The thermal conduction frame 170 may be pressed against the USB connector 152 to be combined with the USB connector 152 and the combining hook 172 may be an auxiliary combining means. The combining hook 172 may be formed downward or upward. The combining hook 172 formed downward may be combined with the first PCB S1 and the combining hook 172 formed upward may be combined with the second PCB S2. The number and direction of the combining hook 172 may be changed if required.

Figure 7:
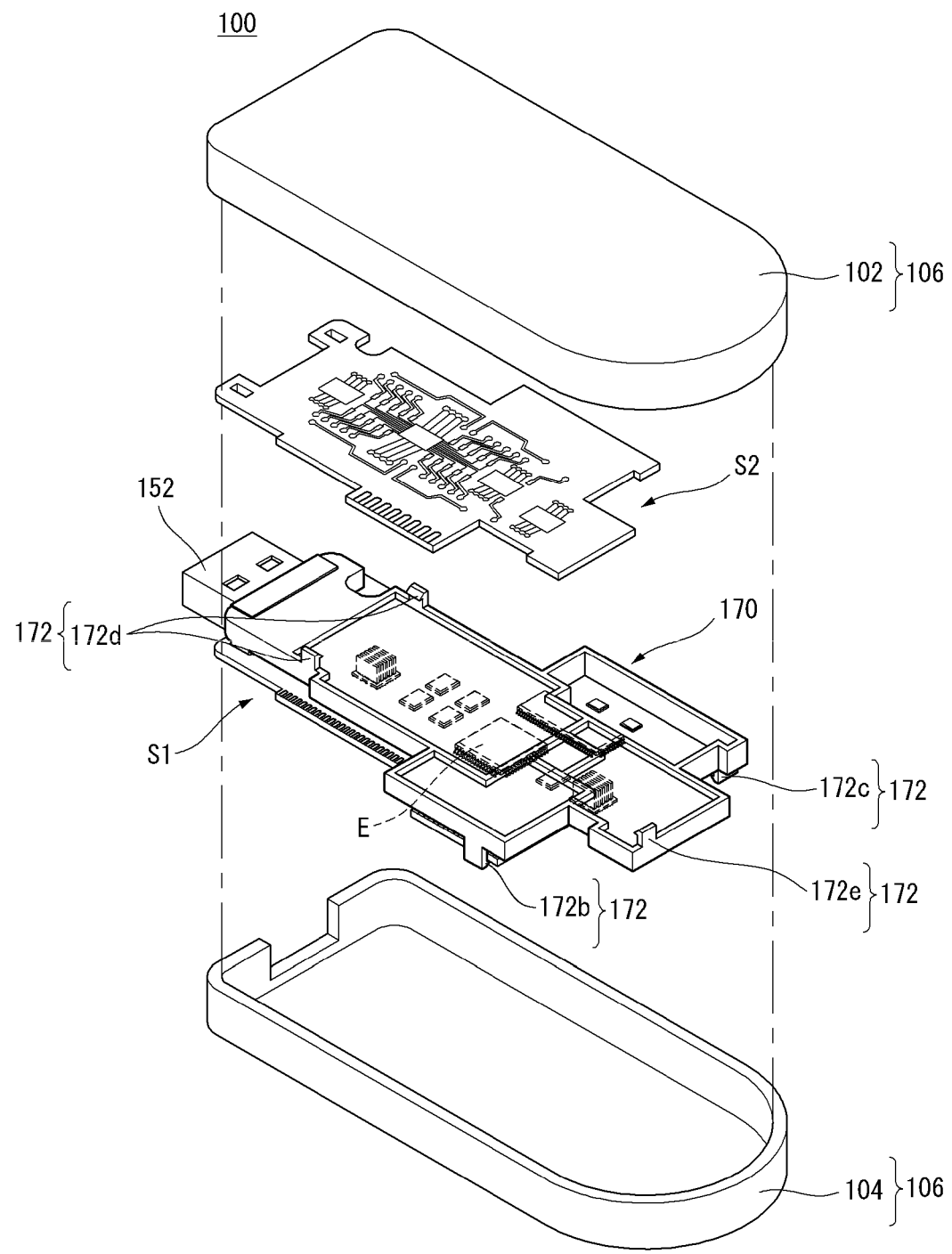
FIG. 7 illustrates a combination of a first PCB of the mobile terminal shown in FIG. 5 and a thermal conduction frame.

FIG. 7 illustrates the mobile terminal 100 with the thermal conduction frame 170 combined with the first PCB S1, shown in FIG. 6.

Referring to FIG. 7, the thermal conduction frame 170 is combined with the first PCB S1 to assemble the mobile terminal 100.

Although the elements E mounted on the first PCB S1 are denoted by dotted lines in FIG. 7 for convenience of understanding, the elements E may not be observed from the outside when the thermal conduction frame 170 is combined with the first PCB S1.

The thermal conduction frame 170 may be combined with the first PCB S1 using the combining hook 172 extended from the thermal conduction frame 170. That is, first, second and third combining hooks (172a shown in FIG. 8), 172b and 172c extended downward from the thermal conduction frame 170 can be combined with the first PCB S1. The first, second and third combining hooks (172a shown in FIG. 8), 172b and 172c can be respectively combined with corresponding points of the first PCB S1 to maintain the combination of the thermal conduction frame 170 and the first PCB S1.

Fourth and fifth combining hooks 172d and 172e may be combined with the second PCB S2. When the fourth and fifth combining hooks 172d and 172e are combined with the second PCB S2, the second PCB S2 can be closely attached to the thermal conduction frame 170 with more than a specific bonding force. When the second PCB S2 is closely attached to the thermal conduction frame 170, the elements E mounted on the second PCB S2 and the thermal conduction frame 170 can be closely attached to each other. Then, the heat generated from the elements E mounted on the second PCB 170 can be naturally transferred toward the thermal conduction frame 170.

Figure 8:
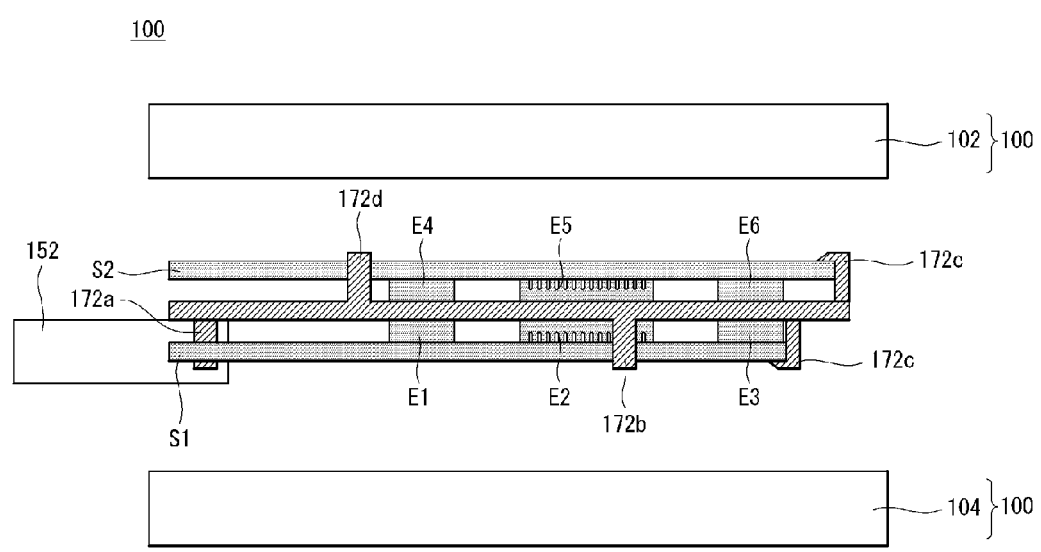
FIG. 8 is a side view of the mobile terminal shown in FIG. 5 when components of the mobile terminal other than upper and lower cases are assembled.

FIG. 8 is a side view of the mobile terminal 100 shown in FIG. 5 when components other than the upper and lower cases 102 and 103 are assembled.

Referring to FIG. 8, the mobile terminal 100 may include the thermal conduction frame 170 combined between the first and second PCBs S1 and S2.

First, second and third elements E1, E2 and E3 mounted on the first PCB S1 may be closely bonded to the bottom face of the thermal conduction frame 170 and fourth, fifth and sixth elements E4, E5 and E6 mounted on the second PCB S2 may be closely attached to the top face of the thermal conduction frame 170. Elements with uneven surfaces, such as the second and fifth elements E2 and E5, may partially come into contact with the thermal conduction frame 170 and may not partially come into contact with the thermal conduction frame 170. Furthermore, all the elements E may not directly come into contact with the thermal conduction frame 170, as described above.

The first through sixth combining hooks 172a through 172e can be combined with the first and second PCBs S1 and S2 so as to closely bond the first through sixth elements E1 through E6 to the thermal conduction frame 170.

Figure 9:
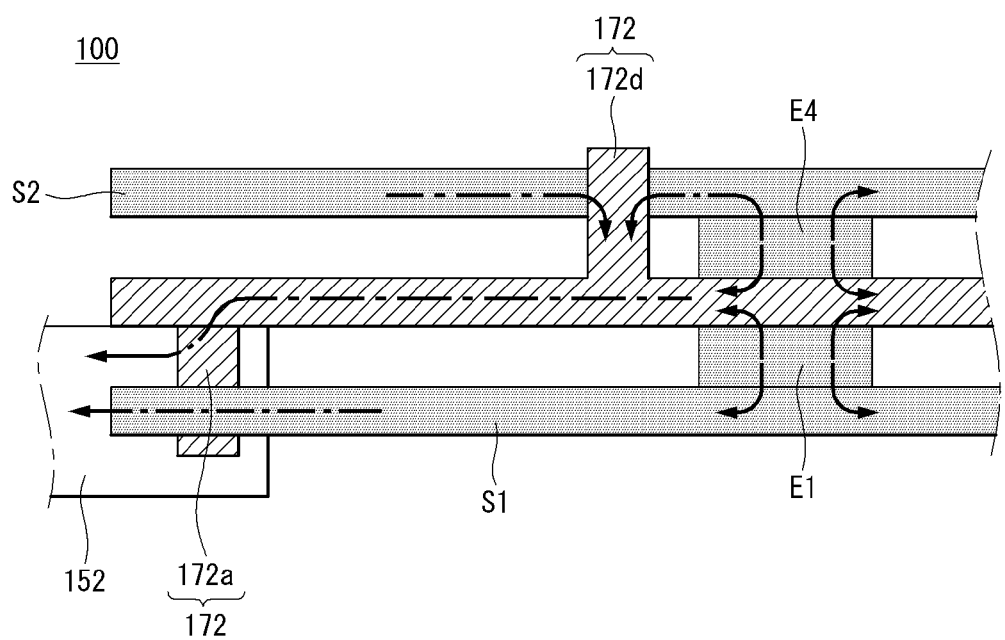
FIG. 9 is a magnified view of a USB connector shown in FIG. 8.

FIG. 9 is a magnified view of the USB connector 152 shown in FIG. 8.

Referring to FIG. 9, heat generated from the first and fourth elements E1 and E4 may be transferred to the USB connector 152 through the thermal conduction frame 170. The heat generated from the first and fourth elements E1 and E4 may be transferred toward the thermal conduction frame 170 and the first and second PCBs S1 and S2. However, the quantity of heat transferred to the first and second PCBs S1 and S2 having low thermal conductivity may be relatively small.

The heat transferred to the thermal conduction frame 170 and the first and second PCBs S1 and S2 may be transmitted to the USB connector 152 having a relatively low temperature. Specifically, the heat generated from the first element E1 may be transferred through the thermal conduction frame 170 and the first combining hook 172a to the USB connector 152. The heat generated from the fourth element E4 may be transferred to the thermal conduction frame 170 and the fourth combining hook 172d. Although FIG. 9 illustrates only the first and fourth elements E1 and E4, heat generated from the other elements can be transferred along the thermal conduction frame 170 to the USB connector 152.

FIG. 10 is a plan view illustrating a connection of the mobile terminal 100 shown in FIG. 4 to the other device 200.

Referring to FIG. 10, the mobile terminal 100 can transfer heat to the device 200 connected thereto. Specifically, the USB connector 152 of the mobile terminal 100 can receive the heat through the thermal conduction frame 170 shown in FIG. 8. The USB connector 152 can transfer the received heat to the device 200. The mobile terminal 100 may be a device that relays radio communication. Accordingly, the mobile terminal 100 may be connected to the device 200 that requires radio communication and provided with power from the device 200 to operate. For example, the USB connector 152 can be connected to a USB port 252 of the device 200. When the USB connector 152 is connected to the USB port 252, the mobile terminal 200 can receive power and a control signal from the device 200 having the USB port 252 and transmit a control signal generated in the mobile terminal 100 to the device 200.

The device 200 may have heat capacity greater than that of the mobile terminal 100. That is, the device 200 may be larger than the mobile terminal 100 and the area of a frame 206 that maintains the stiffness of the device 200 may be greater than the mobile terminal 100. In addition, the device 200 may have the density of elements generating heat, which is lower than that of the mobile terminal 100, and thus the overall temperature of the device 200 may be lower than that of the mobile terminal 100. Particularly, the temperature of the side of the device 200 may be lower than that of the center of the device 200. Accordingly, the heat transferred to the USB connector 152 of the mobile terminal 100 can be easily transmitted to the frame 206 of the device 200. This is because that the heat is moved to eliminate thermal gradient generated between the mobile terminal 100 and the device 200. The total quantity of heat transferred between the mobile terminal 100 and the device 200 may increase as the thermal gradient between the mobile terminal 100 and the device 200 increases. If the temperature of the mobile terminal 100 increases to 70° C. from 50° C. when the temperature of the device 200 is 30° C., for example, the thermal gradient increases. This increases the quantity of heat transferred from the mobile terminal 100 to the device 200. On the contrary, when the temperature of the mobile terminal 100 decreases to 50° C. from 70° C., the thermal gradient decreases and the quantity of heat transferred from the mobile terminal 100 to the device 200 is also reduced. It is possible to maintain the temperature of the mobile terminal 100 in an appropriate range since the quantity of heat transferred between the mobile terminal 100 and the device 200 is controlled by a temperature difference between the mobile terminal 100 and the device 200.

Figure 11:
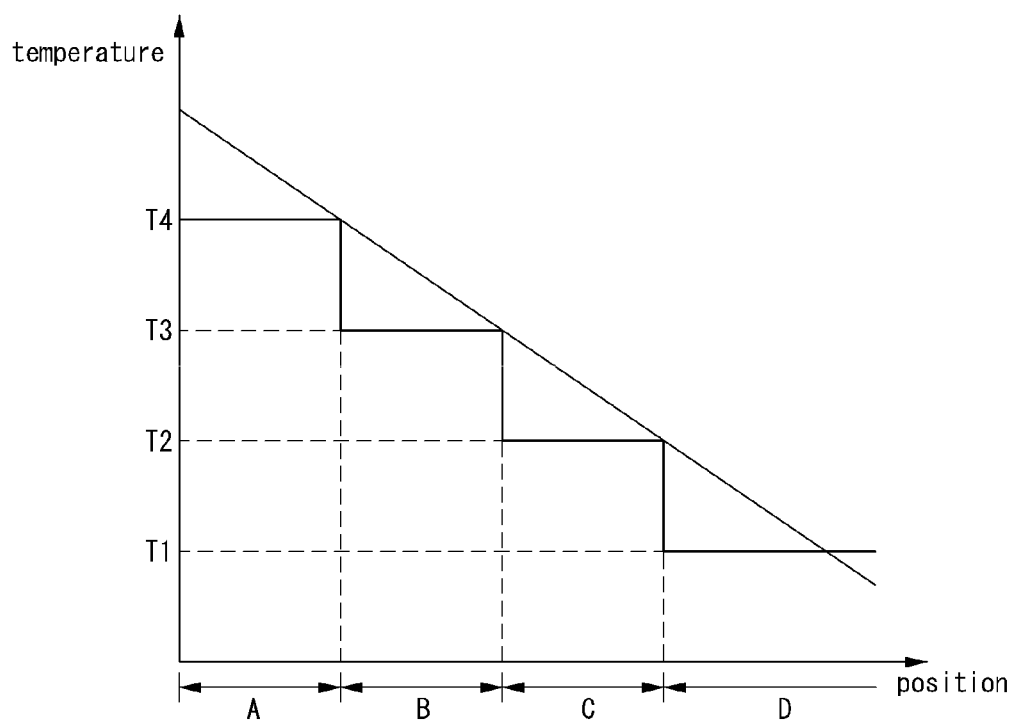
FIG. 11 is a graph showing temperature gradient in the mobile terminal and the device shown in FIG. 10.

FIG. 11 is a graph showing the temperature gradient between the mobile terminal 100 and the device 200.

Referring to FIG. 11, the temperature gradient may exist between the mobile terminal 100 and the device 200. The X-axis represents the positions of the elements, the thermal conduction frame, the USB connector and the device and the Y-axis represents temperature. Specifically, sections A, B, C and D on the X-axis respectively correspond to the elements, the thermal conduction frame, the USB connector and the device. As shown in FIG. 11, the temperature is the highest in the section A and gradually decreases to reach the lowest in the section D. That is, negative thermal gradient is generated through the sections A, B, C and D.

Heat flows from a high-temperature point to a low-temperature point according to the second law of thermodynamics. Accordingly, heat can be transferred according to the thermal gradient from the section A to the section D. Heat transfer can smoothly occur in the mobile terminal 100 since the thermal conduction frame 170 is interposed between the elements E and the USB connector 152.

Figure 12:
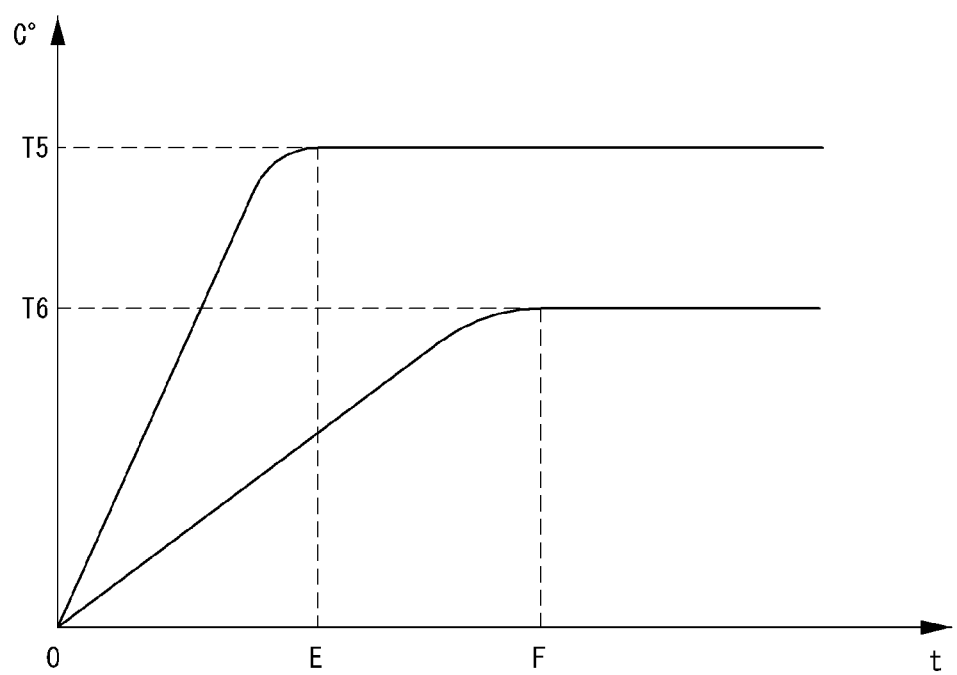
FIG. 12 is a graph showing the effect of the mobile terminal shown in FIG. 4.

FIG. 12 is a graph showing the effect of the mobile terminal 100 shown in FIG. 4.

Referring to FIG. 12, if the mobile terminal 100 does not include the thermal conduction frame 170, the internal temperature of the mobile terminal 100 may sharply increase to a fifth temperature T5 and then achieve equilibrium. That is, heat generated from the elements E cannot be emitted to the outside of the mobile terminal 100, and thus the mobile terminal 100 has a high internal temperature. When the mobile terminal 100 includes the thermal conduction frame 170, the internal temperature of the mobile terminal 100 may gradually increase to a sixth temperature T6 and then achieves equilibrium. That is, the heat generated from the elements E is emitted to the outside of the mobile terminal 100 through the thermal conduction frame 170, and thus the internal temperature of the mobile terminal 100 slowly increases. Furthermore, the internal temperature of the mobile terminal 100 reaches thermal equilibrium state at a relatively low temperature since the heat is continuously radiated.

Figure 13:
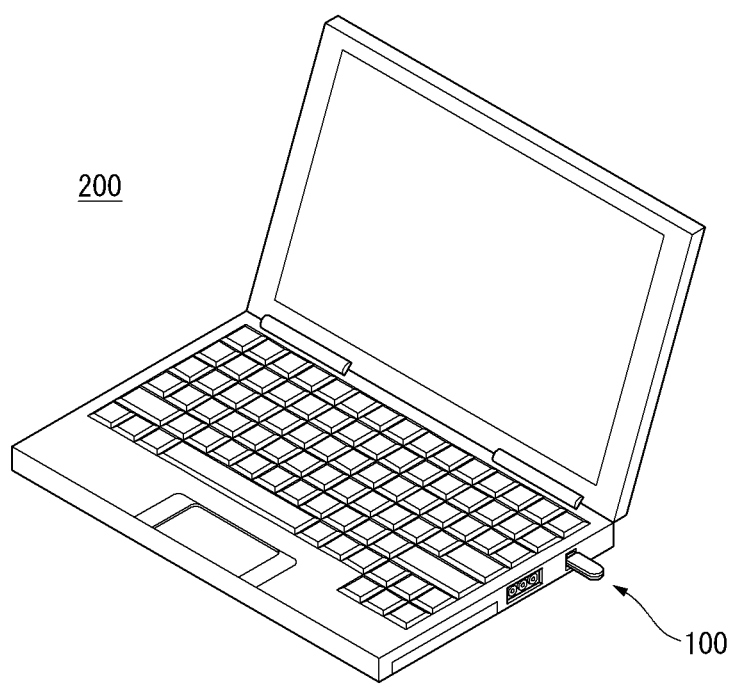
FIGS. 13 and 14 illustrate implementations of using the mobile terminal shown in FIG. 4.
Figure 14:
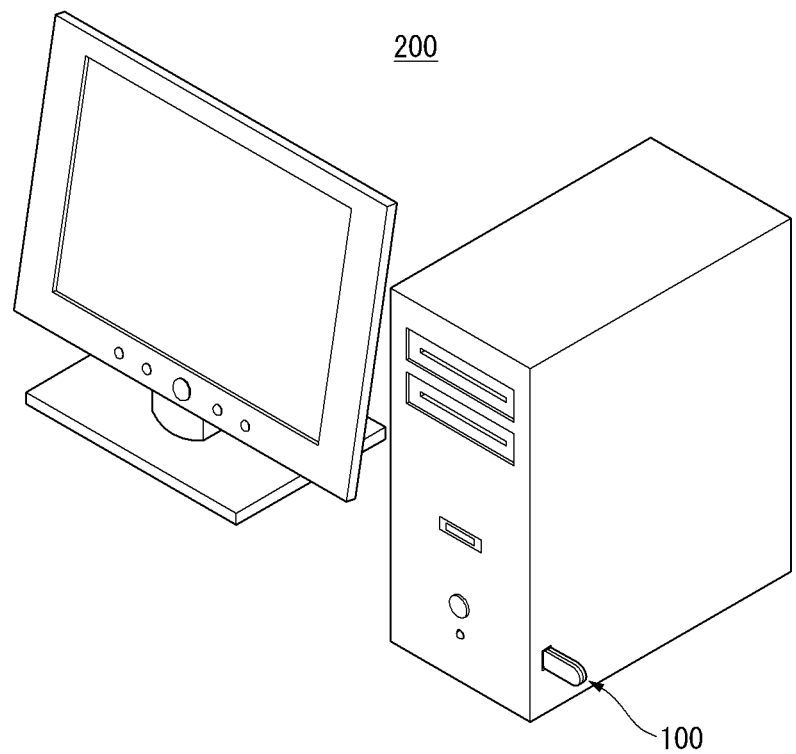

FIGS. 13 and 14 illustrate implementations of using the mobile terminal 100 shown in FIG. 4.

Referring to FIGS. 13 and 14, the mobile terminal 100 can be connected to various other devices. Specifically, the mobile terminal 100 can be connected to a notebook computer 200 as shown in FIG. 13 and connected to a desktop computer 200 as shown in FIG. 14. That is, the mobile terminal 100 can be connected to any device that requires relay of communication.

The device 200 can be larger than the mobile terminal 100, as shown in FIGS. 13 and 14. Accordingly, the heat capacity of the device 200 is greater than that of the mobile terminal 100, and thus heat generated in the mobile terminal 100 can be effectively transferred to the device 200.

Figure 15:
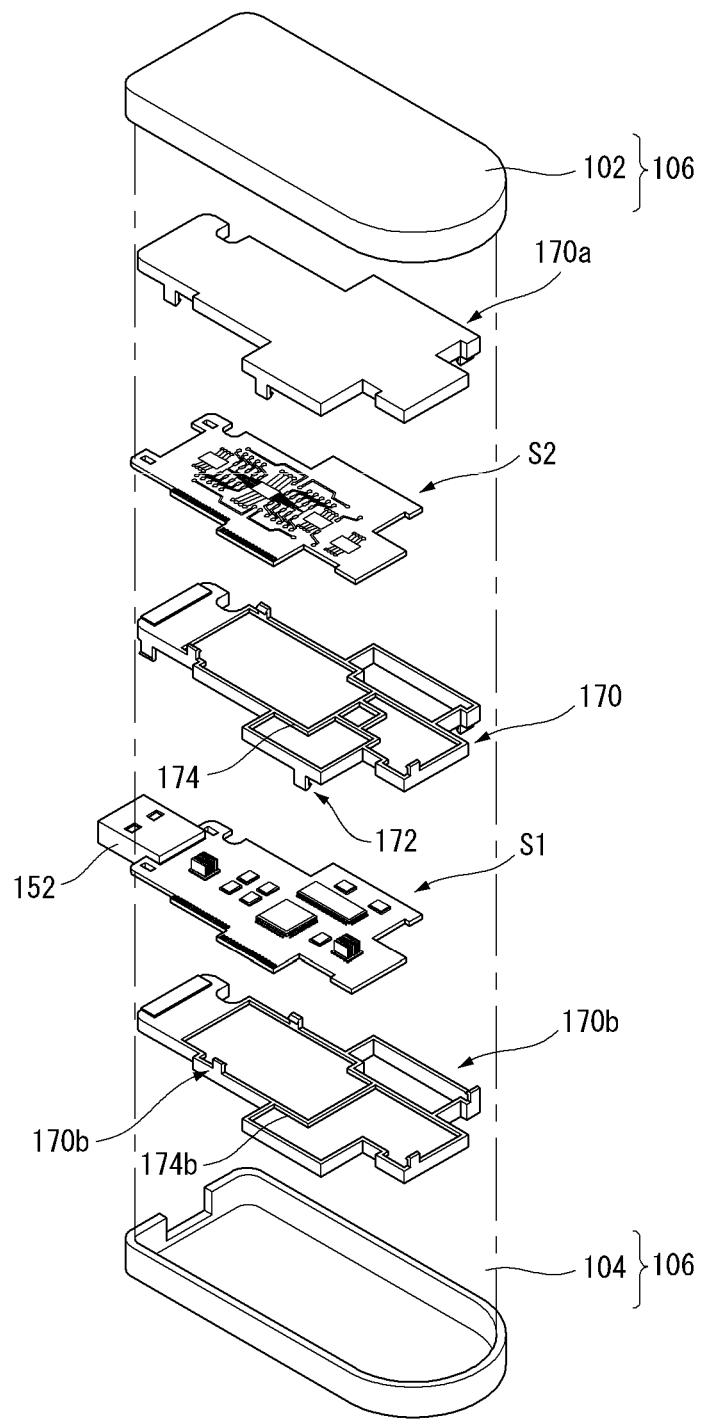
FIG. 15 is an exploded perspective view of another implementation of a mobile terminal according to this document.

FIG. 15 is an exploded perspective view of another implementation of the mobile terminal 100 of this document.

Referring to FIG. 15, the mobile terminal 100 may include a first thermal conduction frame 170 interposed between the first and second PCBs 51 and S2 and second and third thermal conduction frames 170a and 170b respectively located above the first PCB 51 and below the second PCB S2. The mobile terminal 100 can use the first, second and third thermal conduction frames 170, 170a and 170b made of a metal, which can effectively transfer heat, to dissipate heat generated from the first and second PCBs 51 and S2 more efficiently.

Figure 16:
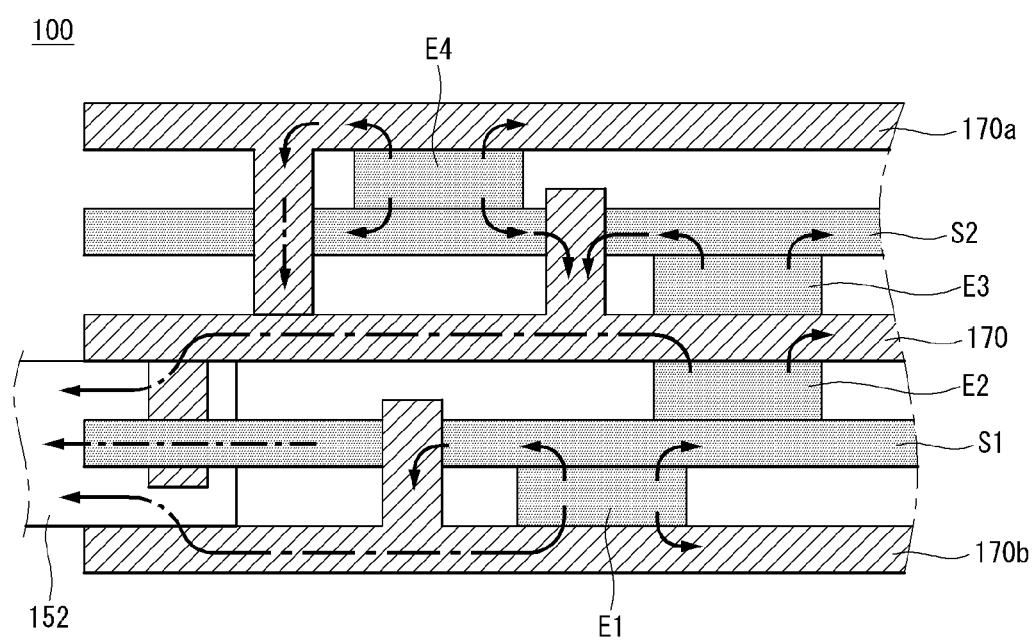
FIG. 16 is a cross-sectional view of the mobile terminal shown in FIG. 15 when components of the mobile terminal other than upper and lower cases are assembled.

FIG. 16 is a side view of the mobile terminal 100 shown in FIG. 15 when components of the mobile terminal 100 other than the upper and lower cases are assembled.

Referring to FIG. 16, heat generated from the first, second, third and fourth elements E1, E2, E3 and E4 mounted on the first and second PCBs S1 and S2 can be transferred to the USB connector 152 through the first, second and third thermal conduction frames 170, 170a and 170.

Figure 17:
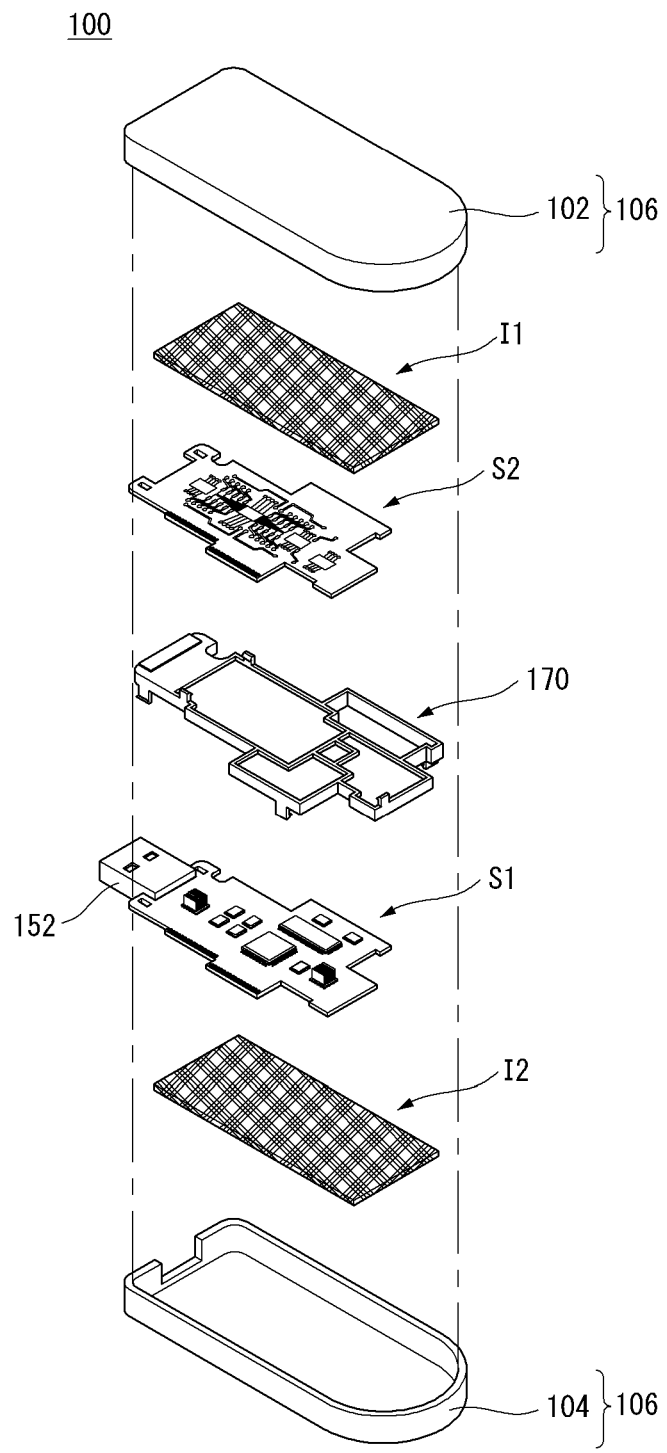
FIG. 17 is an exploded perspective view of another implementation of a mobile terminal according to this document.

FIG. 17 is an exploded perspective view of another implementation of the mobile terminal 100 of this document.

Referring to FIG. 17, the mobile terminal 100 may include a first insulator I1 interposed between the upper case 102 and the second PCB S2 and a second insulator I2 interposed between the lower case 104 and the first PCB S1. Since the first and second insulators I1 and I2 are provided inside the case 106, it is possible to prevent heat from being emitted toward the case 106. If heat is not radiated toward the case 106, the heat generated from the elements E can be accumulated in the mobile terminal 100. This may increase thermal gradient between the mobile terminal 100 and the other device 200. Accordingly, heat can be transferred from the mobile terminal 100 to the other device 200 more actively.

Furthermore, the first and second insulators I1 and I2 can reduce the outer temperature of the case 106 so as to make a user who holds the case 106 feel that the temperature of the mobile terminal 100 is not high. This can improve emotional quality.

Figure 18:
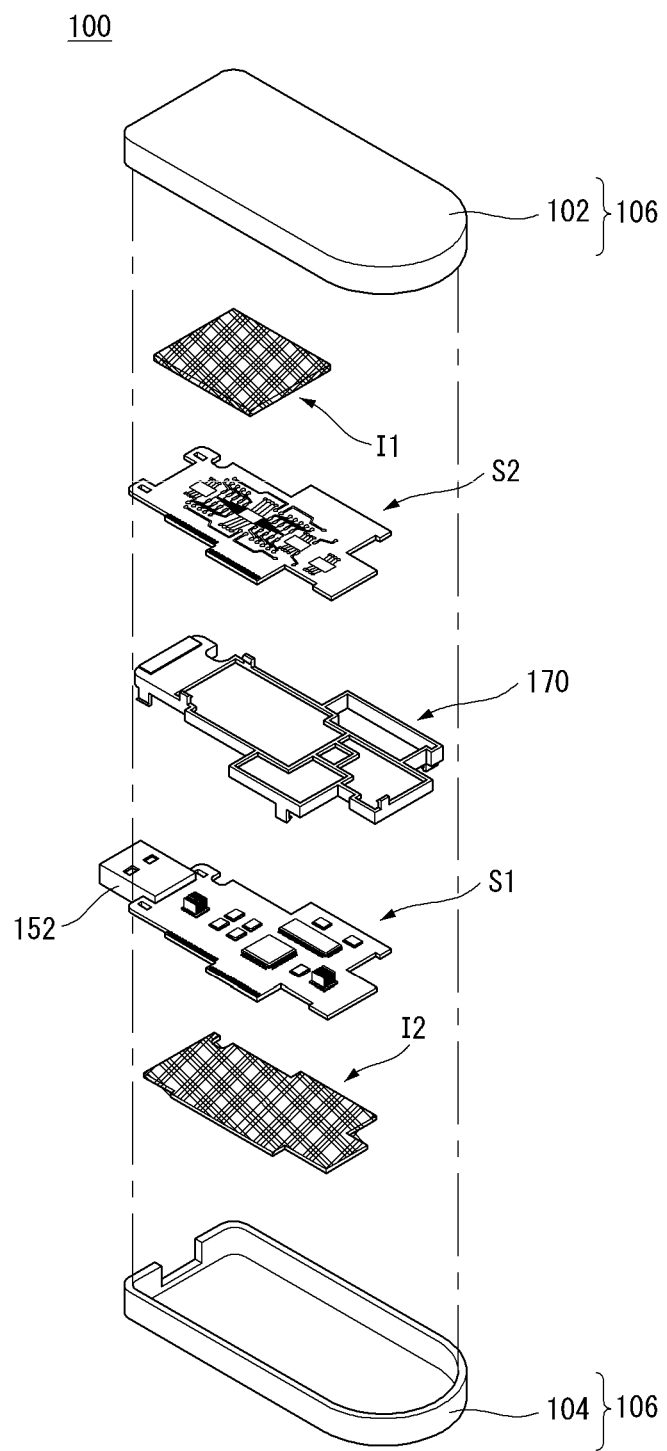
FIG. 18 is an exploded perspective view of another implementation of a mobile terminal according to this document.

FIG. 18 is an exploded perspective view of another implementation of the mobile terminal 100 of this document.

Referring to FIG. 18, the mobile terminal 100 may include the first and second insulators I1 and I2 in various forms. The first and second insulators I1 and I2 may respectively correspond to only parts of the inner sides of the upper and lower cases 102 and 104. That is, only an element that particularly generates a large amount of heat or only a portion of the case 106, which is gripped by the user, can be insulated. This can reduce the manufacturing cost.

Figure 19:
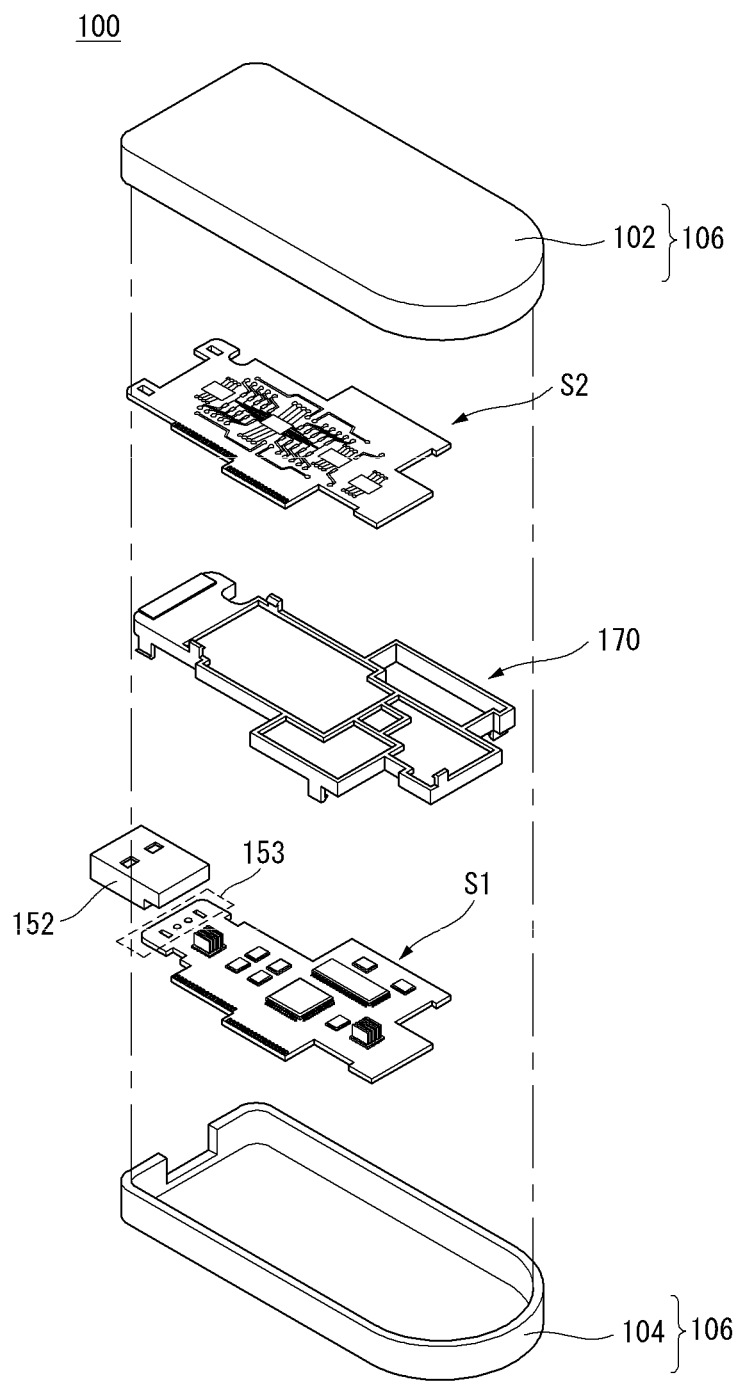
FIG. 19 is an exploded perspective view of another implementation of a mobile terminal according to this document.
Figure 20:
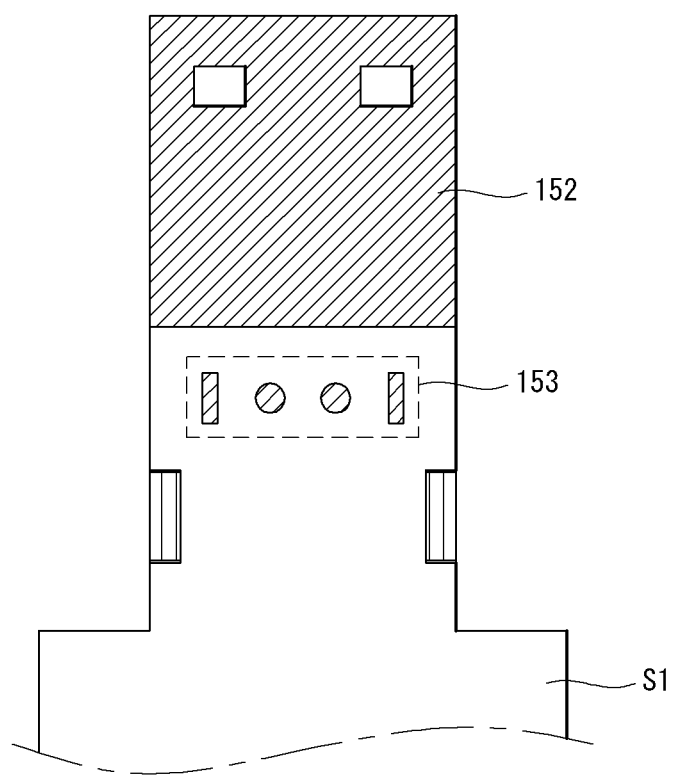
FIG. 20 is a bottom view of a USB connector of the mobile terminal shown in FIG. 19.

FIG. 19 is an exploded perspective view of another implementation of the mobile terminal 100 of this document and FIG. 20 is a bottom view of the USB connector 152 shown in FIG. 19.

Referring to FIGS. 19 and 20, the USB connector 152 of the mobile terminal 100 may be connected to the top face of the first PCB S1. The first PCB S1 may include multiple combining holes 153 through which a rib extended from the USB connector 152 can be combined with the first PCB S1. The USB connector 152 can be connected to the first PCB S1 by inserting the rib extended from the USB connector 152 into the combining holes 152 formed at one end of the first PCB S1. In addition, the USB connector 152 can be connected to the first PCB S1 through various methods.

Figure 21:
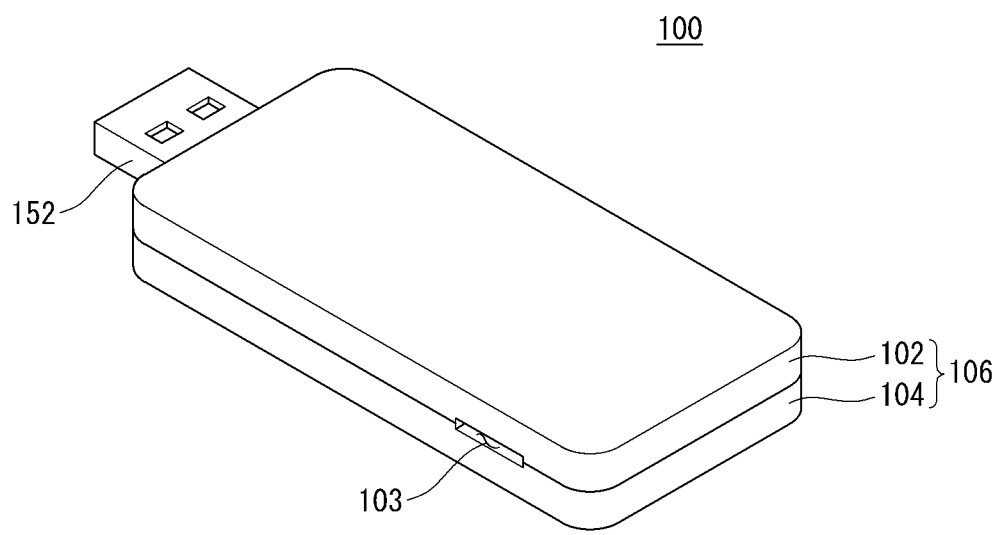
FIG. 21 is a perspective view of the mobile terminal shown in FIG. 4.

FIG. 21 is a perspective view of the mobile terminal 100 shown in FIG. 4.

Referring to FIG. 21, the mobile terminal 100 may include the case 106 and the USB connector 152 projected from the front end of the case 106. The case 106 forms the external appearance of the mobile terminal 100. The case 106 can protect the internal components of the mobile terminal 100 from external impact, temperature variation and humidity variation. To achieve this, the case 106 may be made of a synthetic resin such as engineering plastic. Referring to FIG. 21, the case 106 may have a straight shape. That is, the case 106 can be formed in a bar shape without having a bent portion. However, the shape of the case 106 of the mobile terminal 100 is not limited thereto. The case 106 may be formed in such a manner that the first and second cases 102 and 104 are separately formed and assembled. The case 106 may have a slot 103.

The slot 103 may be formed such that it is connected to a carrier insertion hole (173 shown in FIG. 23) provided inside the case 106. The slot 103 may serve as a passage through which an identify module card (C shown in FIG. 23) is inserted into the mobile terminal 100. The position and size of the slot 203 is determined based on the type of the identify module card (C shown in FIG. 23).

Figure 26:
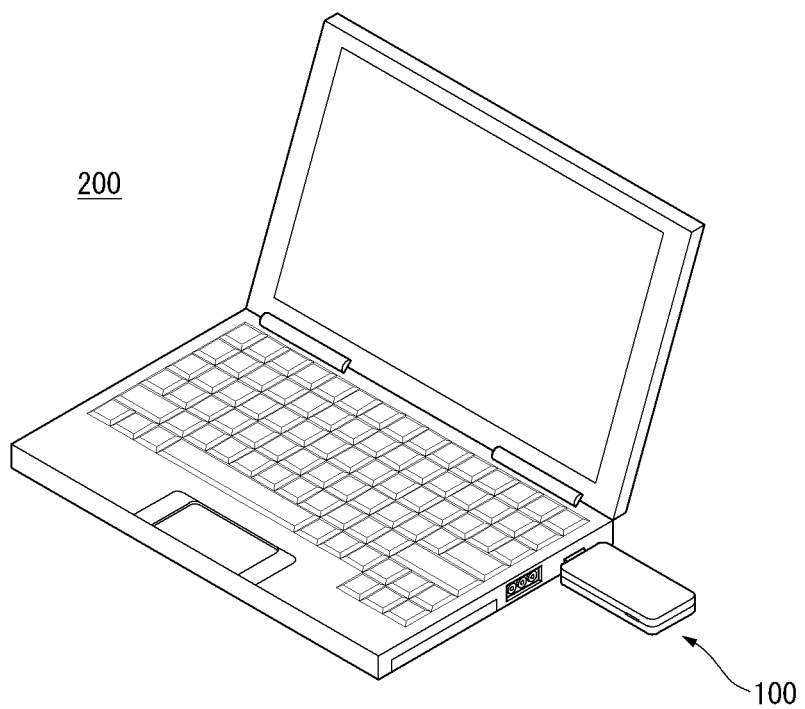
FIG. 26 illustrates an implementation of using the mobile terminal shown in FIG. 4.

The USB connector 152 connects the internal circuit of the mobile terminal 100 and the other device (200 shown in FIG. 26). That is, the USB connector 152 electrically connects the elements (E shown in FIG. 23) provided inside the mobile terminal 100 to elements included in the other device (200 shown in FIG. 26). The USB connector 152 includes contacts and is covered with a metal material according to standards. The USB connector 152 covered with a metal material can secure specific stiffness when connected to the other device (200 shown in FIG. 26).

Figure 22:
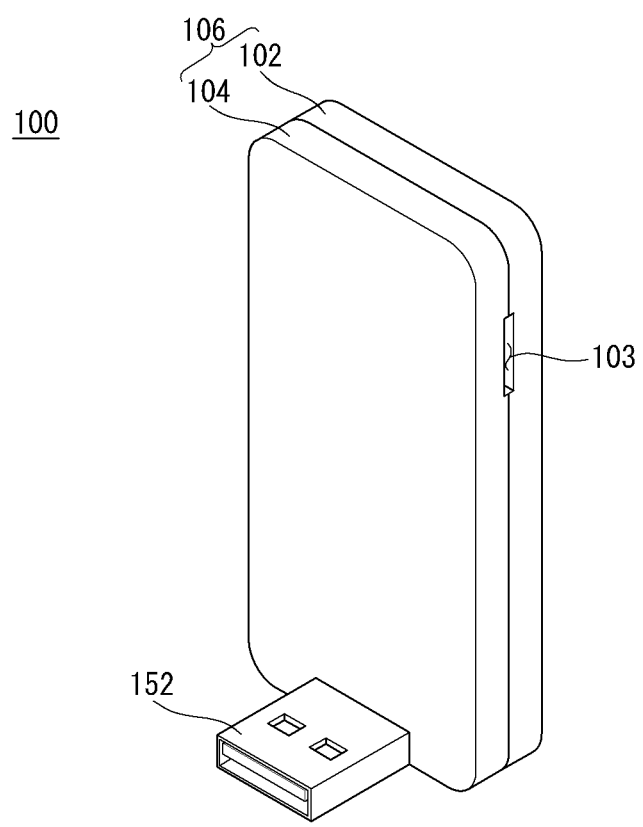
FIG. 22 is a perspective view of another implementation of a mobile terminal according to this document.

FIG. 22 is a perspective view of another implementation of the mobile terminal 100 of this document.

Referring to FIG. 22, the mobile terminal 100 may have an L shape. That is, the USB connector 152 is connected to the case 106 at an angle of 90° to the end of the case 106. The mobile terminal 100 in the L shape can allow the side space of the other device (200 shown in FIG. 26) to be effectively used when the mobile terminal 100 is connected to the other device (200 shown in FIG. 26). The USB connector 152 may be provided such that it can turn on the case 106, which is not shown. That is, the USB connector 152 can be rotated according to user's choice to change the shape of the mobile terminal 100 to a straight shape or an L shape.

Figure 23:
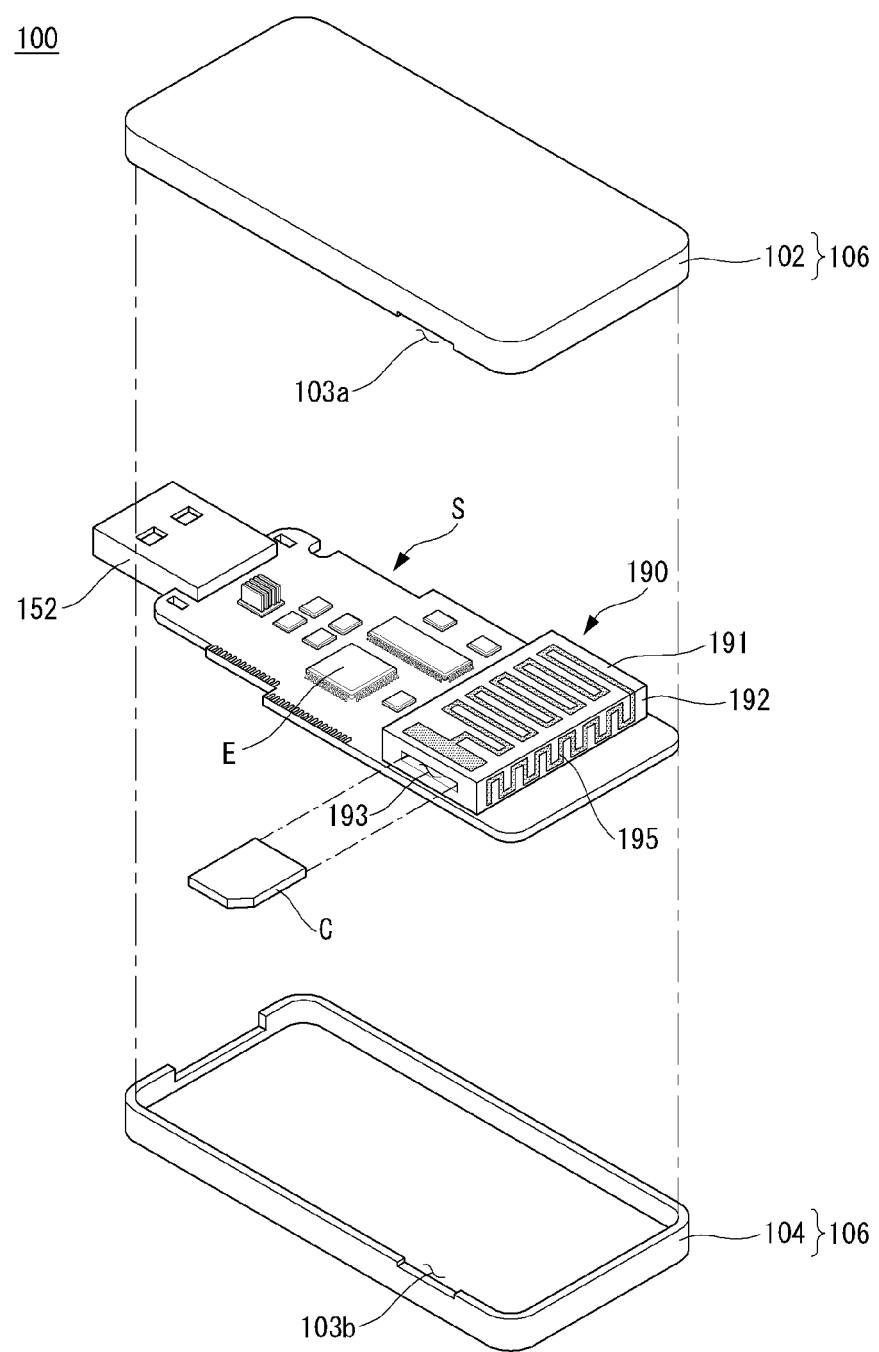
FIG. 23 is an exploded perspective view of the mobile terminal shown in FIG. 4.

FIG. 23 is an exploded perspective view of the mobile terminal 100 shown in FIG. 4.

Referring to FIG. 4, the mobile terminal 100 may include a PCB S provided inside the case 106 and an antenna carrier 190 mounted on one end of the PCB S. The PCB S may include elements E required for the mobile terminal 100 to operate. The elements E may be constructed such that they can perform communication according to LTE. That is, the elements E can receive radio data, send the received radio data to the other device (200 shown in FIG. 26) and wirelessly transmit data received from the other device (200 shown in FIG. 200) through communication according to LTE. Although FIG. 23 illustrates a single PCB, multiple PCBs can be provided to the mobile terminal 100. That is, multiple PCBs can be stacked inside the case 106. Furthermore, a structure capable of effectively emitting heat generated from the elements E may be combined with the PCB S. The USB connector 152 may be combined with the end of the PCB S opposite to the end thereof on which the antenna carrier 190 is mounted.

The antenna carrier 190 may be mounted opposite to the USB connector 152. As described above, the USB connector 152 is connected to the other device (200 shown in FIG. 26), and thus the USB connector 152 is likely to be exposed to electromagnetic waves generated from the other device (200 shown in FIG. 26). In addition, electromagnetic waves may be generated from the contact of the USB connector 152, which is connected to a USB port (not shown) of the other device (200 shown in FIG. 26). To minimize the influence of the electromagnetic waves, the antenna carrier 190 may be provided opposite to the USB connector 152. That is, the USB connector 152 and the antenna carrier 190 can be respectively provided to one side and the other side of the PCB S in the longitudinal direction of the PCB S.

The antenna carrier 190 may be mounted on the PCB S in various forms. For example, the antenna carrier 190 can be placed on the top face or bottom face of the PCB S, as shown in FIG. 23. Furthermore, the antenna carrier 190 may be inserted into an end of the PCB S.

Figure 24:
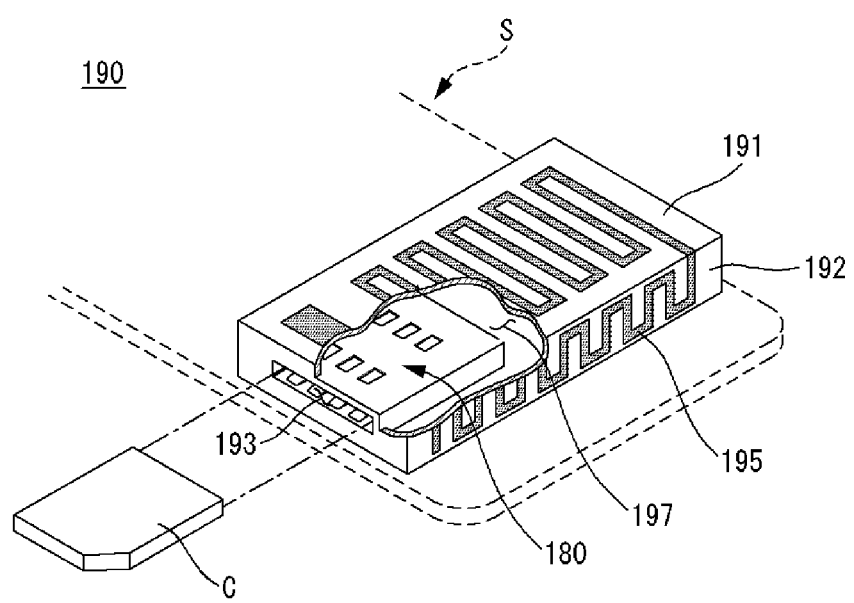
FIG. 24 is an exploded perspective view illustrating part of an antenna carrier shown in FIG. 23.

The antenna carrier 190 may be in a hexadral shape having an inner space (197 shown in FIG. 24) with a specific solid content. When low-band and multi-band antennas of LTE are implemented, it may be required to extend the solid content of the antenna carrier 190 to satisfy required performance. In this case, an antenna pattern 195 of the antenna carrier 190 may be formed over multiple faces of the hexadral antenna carrier 190, as shown in FIG. 24. That is, the antenna pattern 195 can be formed on first and second faces 191 and 192 of the antenna carrier 190. Furthermore, the antenna pattern 195 may be formed on more than two faces of the antenna carrier 190. The antenna pattern 195 may be formed in zigzag such that the antenna pattern 195 in a larger area is formed in a minimum region. The core technology of fourth generation mobile communication is multi-input multi-output (MIMO) technology. The MIMO technology, which is a multi-antenna signal processing method that transmits/receives data using multiple antennas in a mobile environment, can simultaneously transmit/receive data through the multiple antennas to achieve broadband wireless data communication and remarkably increase a transmitting/receiving speed to improve transmission efficiency. When signals are transmitted/received through N antennas arranged in a transmitting side and N antennas arranged in a receiving side using the MIMO technology, the transmission rate can be increased N times. Particularly, if the MIMO technology is used together with OFDM used for LTE, the transmission speed and data capacity can be improved so as to construct an environment most suitable for multimedia services. The OFDM that is a technique of dividing and allocating frequency and time can divide a single channel into multiple sub-channels, transmit the sub-channels, save bandwidths according to overlapping between sub-channels and divide a frequency band into hundreds of bands to minimize frequency interference. To employ this fourth generation mobile communication technology, N antenna patterns 195 can be formed on the antenna carrier 190. The antenna carrier 190 can be formed in a shape having a specific solid content, such as a hexahedron, to form the antenna pattern 195 on multiple faces thereof. Accordingly, the space (197 shown in FIG. 24) can be formed inside the antenna carrier 190.

The carrier insertion hole 193 can be formed at one side of the antenna carrier 190. The carrier insertion hole 193 can be formed in a position corresponding to slots 103a and 103b formed in the case 106. Accordingly, when the user inserts the identify module card C into the slots 103a and 103b, the identify module card C can naturally pass through the carrier insertion hole 193. The slots 103a and 103b may be formed in a position other than the position shown in FIG. 23, which will be described in detail below. If the position of the slots 103a and 103b is changed, the position of the carrier insertion hole 193 may be also changed to correspond to the position of the slots 103a and 103b.

FIG. 24 is an exploded perspective view of the antenna carrier 190 show in FIG. 23.

Referring to FIG. 24, the antenna carrier 190 may include an identify card socket 180 provided in the internal space 197 thereof. The identify card socket 180 is a socket into which the identify module card C that may be one of a user identify module (UIM), a subscriber identify module (SIM), and a universal subscriber identify module (USIM) can be inserted. The space 197 is naturally formed in the antenna carrier 190 due to the structure of the hexadral antenna carrier 190, as described above, and thus there is no need to additionally form a space for installing the identify card socket 180. Accordingly, the size of the mobile terminal 100 does not increase even when the identify card socket 180 is formed in the mobile terminal 100. As described above, portability among the performances of the mobile terminal 100 is an important factor. Therefore, the attraction of the mobile terminal 100 can be improved since the solid content of the mobile terminal 100 does not increase even when the mobile terminal 100 includes the identify card socket 180.

The identify card socket 180 may include a terminal 181. The terminal 181 may be bonded to the identify card socket 180 through soldering, for example. The terminal 181 comes into contact with a card terminal (not shown) formed on the backside of the identify module card C when the identify module card C is inserted into the identify module card socket 180, and thus data exchange between the identify module card C and the mobile terminal 100 can be performed. The carrier insertion hole 193 has a width substantially identical to that of the identify module card C and is connected to the slot (103 shown in FIGS. 21 and 22).

Figure 25:
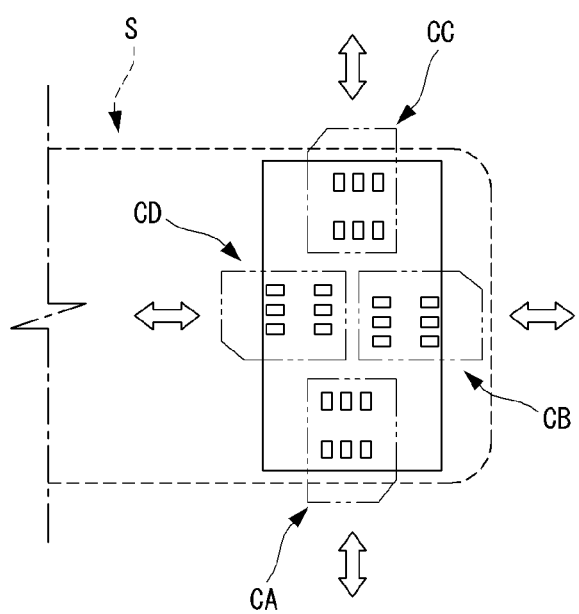
FIG. 25 is a plan view of the antenna carrier shown in FIG. 24.

FIG. 25 is a plan view of the antenna carrier 190 shown in FIG. 24.

Referring to FIG. 25, the antenna carrier 190 of the mobile terminal 100 may be combined with the identify module card C in various manners. First and third directions CA and CC represent that the identify module card C is inserted into the left and right sides of the antenna carrier 190. To insert the identify module card C into the antenna carrier 190 in the first and third directions CA and CC, positions of related parts such as the slot (103 shown in FIG. 21), the carrier insertion hole (193 shown in FIG. 23) and the identify card socket (180 shown in FIG. 23) must be changed to correspond to the left and right sides of the antenna carrier 190.

Second and fourth directions CB and CD represent that the identify module card C is inserted into the front and rear sides of the antenna carrier 190. In the case of the fourth direction CD, the identify module card C is mounted inside the case (106 shown in FIG. 23), and thus the identify module card C may be inserted into the mobile terminal 100 during the mobile terminal 100 assembling process.

The identify module card C can be inserted into the mobile terminal 100 in various directions in addition to the first, second, third and fourth directions CA, CC, CB and CD if required.

Other implementations are within the scope of the following claims.

What is claimed is:

1. A mobile terminal comprising:
a case;
a first element that generates heat;
a connector configured to connect to another device to provide a data exchange path between the first element and the another device;
a thermal conduction frame having one side coming into thermal contact with the first element and another side coming into thermal contact with the connector to transfer the heat generated by the first element to the connector; and
at least one plate-shaped thermal insulator located inside the case to prevent transfer of the heat generated by the first element to the case.

2. The mobile terminal of claim 1, further comprising a first board on which the first element is mounted, the first board being combined with the thermal conduction frame.

3. The mobile terminal of claim 2, wherein the first board is an upper board, and wherein the mobile terminal further comprises:
a second element that generates heat; and
a lower board on which the second element is mounted, wherein the thermal conduction frame is plate-shaped and is located between the upper board and the lower board.

4. The mobile terminal of claim 2, wherein the first element faces the thermal conduction frame.

5. The mobile terminal of claim 3, wherein the thermal conduction frame includes a shielding rib projecting from the thermal conduction frame to correspond to the first element to prevent electromagnetic waves generated by the first element from being diffused.

6. The mobile terminal of claim 2, wherein the first board is an upper board, and wherein the mobile terminal further comprises:
a second element that generates heat;
a lower board on which the second element is mounted, wherein the thermal conduction frame is plate-shaped and is located between the upper board and the lower board; and
a second thermal conduction frame formed in a plate-shape and located between at least one of the upper board or the lower board and the first thermal conduction frame.

7. The mobile terminal of claim 2, wherein the first board is combined with the thermal conduction frame through at least one combining hook extended from the thermal conduction frame.

8. The mobile terminal of claim 1, wherein the another side of the thermal conduction frame is pressed against at least one side of the connector.

9. The mobile terminal of claim 1, wherein the connector transfers heat received from the thermal conduction frame to the another device.

10. The mobile terminal of claim 1, wherein the thermal conduction frame generates a thermal gradient between the first element and the connector.

11. The mobile terminal of claim 1, wherein the thermal conduction frame is made of one of aluminum, aluminum alloy, copper, or copper alloy.

12. The mobile terminal of claim 1, wherein the connector is a USB connector for connecting to a USB port of the another device.

13. The mobile terminal of claim 1, wherein the first element is at least one of a communication chip including a modem chip, an RF transmitter chip, an RF receiver chip, or a power chip, wherein the power chip includes a power amplifier chip and a power management IC chip.

14. The mobile terminal of claim 1, wherein the thermal conduction frame and the first element are bonded to each other using an adhesive material including thermal grease.

15. A mobile terminal comprising:
a case;
a first element that generates heat;
a connector configured to connect to another device to provide a data exchange path between the first element and the another device;
a thermal conduction frame having one side coming into thermal contact with the connector and another side coming into thermal contact with at least part of the first element to transfer the heat generated by the first element to the connector; and
at least one plate-shaped insulator provided inside the case to prevent transfer of the heat generated by the first element to the case.

16. The mobile terminal of claim 15, further comprising a first board on which the first element is mounted, the first board being combined with the thermal conduction frame.

17. The mobile terminal of claim 15, wherein the thermal conduction frame includes a shielding rib projecting from the thermal conduction frame to correspond to the first element to prevent electromagnetic waves generated by the first element from being diffused.

18. The mobile terminal of claim 16, wherein the first board is combined with the thermal conduction frame through at least one combining hook extended from the thermal conduction frame.

19. The mobile terminal of claim 15, wherein the one side of the thermal conduction frame is pressed against at least one side of the connector.

20. The mobile terminal of claim 15, wherein the connector is a USB connector for connecting to a USB port of the another device.

21. The mobile terminal of claim 15, wherein the another side of the thermal conduction frame is bonded to the first element using an adhesive material including thermal grease.

* * * * *